(12) United States Patent
Fioravanti

(10) Patent No.: US 12,500,553 B2
(45) Date of Patent: Dec. 16, 2025

(54) AUDIO SIGNAL PROCESSING

(71) Applicant: Solid State Logic UK Limited, Oxford (GB)

(72) Inventor: Matteo Fioravanti, Woodstock (GB)

(73) Assignee: Solid State Logic UK Limited, Oxford (GB)

( * ) Notice: Subject to any disclaimer, the term of this patent is extended or adjusted under 35 U.S.C. 154(b) by 828 days.

(21) Appl. No.: 17/736,255

(22) Filed: May 4, 2022

(65) Prior Publication Data

US 2022/0407473 A1   Dec. 22, 2022

(30) Foreign Application Priority Data

Jun. 18, 2021   (GB) .................................... 2108721

(51) Int. Cl.
| | | |
|---|---|---|
| *H03F 1/34* | (2006.01) | |
| *H03G 3/30* | (2006.01) | |
| *H03G 5/16* | (2006.01) | |
| *H04R 3/00* | (2006.01) | |
| *H04R 3/04* | (2006.01) | |
| *G06F 3/16* | (2006.01) | |

(52) U.S. Cl.
CPC ............... *H03F 1/34* (2013.01); *H03G 3/301* (2013.01); *H03G 5/165* (2013.01); *H04R 3/005* (2013.01); *H04R 3/04* (2013.01); *G06F 3/165* (2013.01)

(58) Field of Classification Search
CPC ........ H03F 1/34; H03F 2200/03; H03F 3/181; H03F 3/211; H03G 3/301; H03G 5/165; H03G 3/14; H03G 5/025; H03G 3/30; H03G 1/0088; H03G 1/0023; H03G 3/3042; H04R 3/005; H04R 3/04; G06F 3/165

See application file for complete search history.

(56) References Cited

U.S. PATENT DOCUMENTS 5,282,252 A   1/1994   Orban
5,892,833 A   4/1999   Maag et al.
(Continued)

FOREIGN PATENT DOCUMENTS

EP   2605549 A1   6/2013

OTHER PUBLICATIONS

Corresponding Great Britain Search Report, Application No. GB2108721.8, dated Nov. 13, 2021, 1 page.

*Primary Examiner* — Khanh V Nguyen
(74) *Attorney, Agent, or Firm* — Cooper Legal Group LLC

(57) ABSTRACT

The processing of audio signals is shown in which a first gain-adjustable amplifier is configured to receive a feed forward signal from an input and a second gain-adjustable amplifier is configured to receive a feedback signal from an output. A gain controller supplies a first gain control signal to the first gain-adjustable amplifier, wherein the gain controller supplies a complementary second gain control signal to the second gain-adjustable amplifier, which may be the reciprocal of the first gain control signal. A first combiner is arranged to combine a first output from the first gain-adjustable amplifier with a second output from the second gain-adjustable amplifier. A plurality of filter elements are configured in parallel, wherein each filter element receives an output from the first combiner. A second combiner combines outputs from the filter elements with the original input signal and the filter elements have mutually different filtering characteristic.

16 Claims, 8 Drawing Sheets

(56) References Cited

U.S. PATENT DOCUMENTS

| | | | |
|---|---|---|---|
| 7,142,574 B2 * | 11/2006 | Asuri | H01S 5/06832 |
| | | | 372/38.1 |
| 11,742,805 B2 * | 8/2023 | Xu | H03F 3/193 |
| | | | 330/277 |

* cited by examiner

AUDIO SIGNAL PROCESSING

CROSS REFERENCE TO RELATED APPLICATIONS

This application claims priority from United Kingdom Patent Application number 2108721.8, filed on Jun. 18, 2021, the whole contents of which are incorporated herein by reference.

BACKGROUND OF THE INVENTION

The present invention relates to an audio signal processing apparatus. The present invention also relates to a method of processing an audio signal.

Techniques for processing audio signals are well known and may be conducted upon analog signals or processed in the digital domain. Equalization techniques are performed to modify the spectral density of an audio signal, often to distribute the energy content throughout the available spectrum or to enhance or attenuate particular components within the signal to achieve a more desirable effect.

However, many desirable responses often require multiple adjustments that may in turn introduce new undesirable artefacts.

BRIEF SUMMARY OF THE INVENTION

According to a first aspect of the present invention, there is provided an audio signal processing apparatus, comprising: a first gain-adjustable amplifier configured to receive a feed-forward signal from an input; a second gain-adjustable amplifier configured to receive a feed-back signal from an output; a gain controller configured to supply a first gain control signal to said first gain-adjustable amplifier, and to supply a complementary second gain control signal to said second gain-adjustable amplifier, wherein said complementary second gain control signal is the reciprocal of said first gain control signal; a first combiner arranged to combine a first output from said first gain-adjustable amplifier with a second output from said second gain-adjustable amplifier; and a plurality of filter elements configured in parallel, wherein: each said filter element receives an output from said first combiner; a second combiner combines outputs from said filter elements with the original input signal; and said filter elements have mutually different filtering characteristics.

In an embodiment, an output from each said filter element is supplied to said second combiner via a respective amplifier. The filter elements may all be low-pass filters with mutually different cut-off frequencies and the low-pass filters may a similar circuit topology, with the different cut-off frequencies being established by differing component values.

According to a second aspect of the invention, there is provided a method of processing an audio signal, comprising the steps of: controlling the gain of a first amplification process by a first extent and controlling the gain of a second amplification process by a second extent, wherein said second extent is the reciprocal to said first extent; supplying a feed-forward signal to said first amplification process and supplying a feed-back signal to said second amplification process; combining an output from said first amplification process with an output from said second amplification process; performing a plurality of filtering operations in parallel upon an output from said combining step; and further combining outputs from said filtering operations, wherein said filtering operations have mutually different filtering characteristics.

Embodiments of the invention will be described, by way of example only, with reference to the accompanying drawings. The detailed embodiments show the best mode known to the inventor and provide support for the invention as claimed. However, they are only exemplary and should not be used to interpret or limit the scope of the claims. Their purpose is to provide a teaching to those skilled in the art. Components and processes distinguished by ordinal phrases such as "first" and "second" do not necessarily define an order or ranking of any sort.

DETAILED DESCRIPTION OF EMBODIMENTS OF THE INVENTION

FIG. 1

Figure 1:
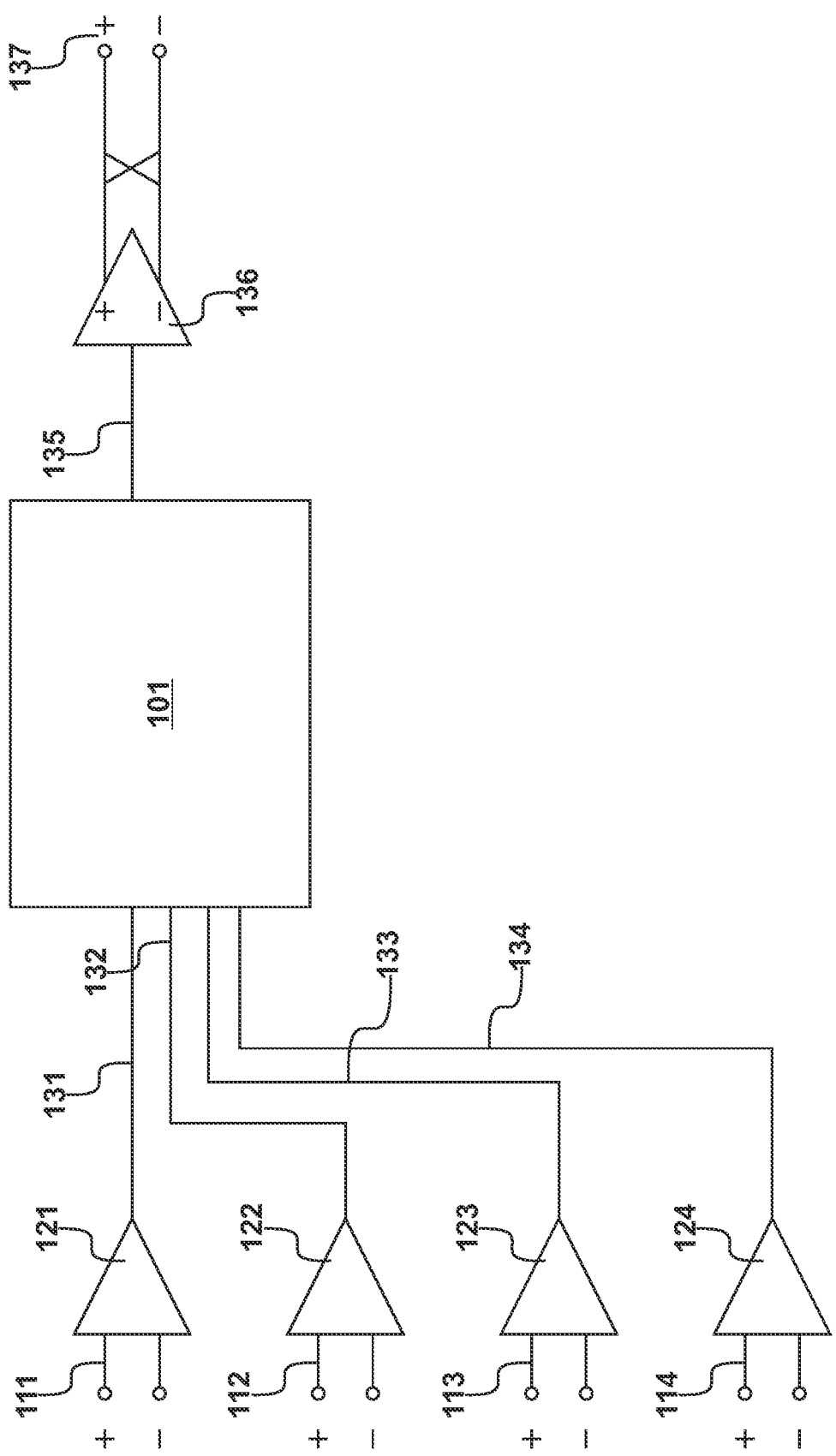
FIG. 1 shows a system for processing an audio signal.

A system 101 for processing an audio signal is shown in FIG. 1. The processing system may receive an individual channel or, as illustrated in FIG. 1, several channels. In addition, several channels may be pre-combined onto a bus.

In the example shown in FIG. 1, a first balanced signal 111 is received along with a second balanced signal 112, a third balanced signal 113 and a fourth balanced signal 114. Respective differential amplifiers 121, 122, 123 and 124 perform subtractions to remove common mode noise and thereby present unbalanced signals on respective input lines 131, 132, 133 and 134.

An unbalanced output is provided on an output line 135, which is in turn supplied to a differential amplifier 136 to provide a balanced output on output lines 137.

FIG. 2

Embodiments of the invention may be implemented using analog components, as described with reference to FIGS. 2 to 4. Alternatively, signal processing may be performed upon digital signals, using dedicated hardware components or by using a programmable device performing procedures described with reference to FIG. 7 and FIG. 8.

Figure 2:
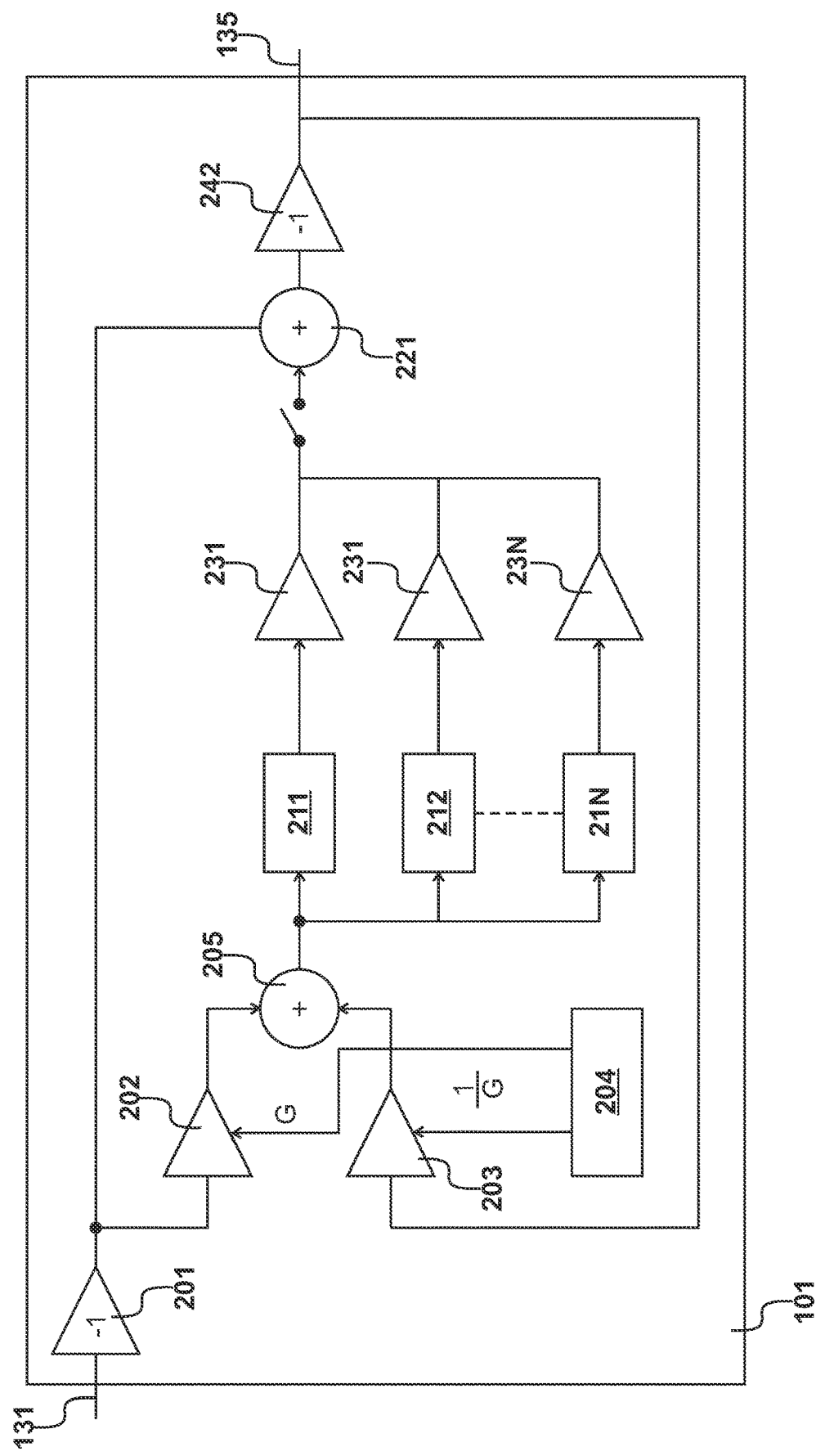
FIG. 2 shows an example of an audio signal processing apparatus.
Figure 3:
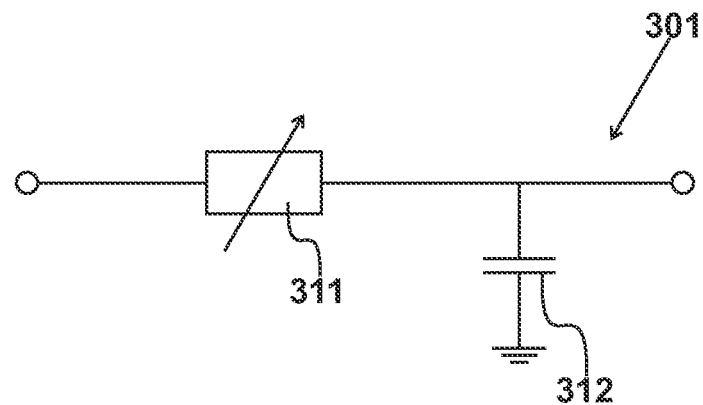
FIG. 3 shows examples of filter elements.
Figure 3:
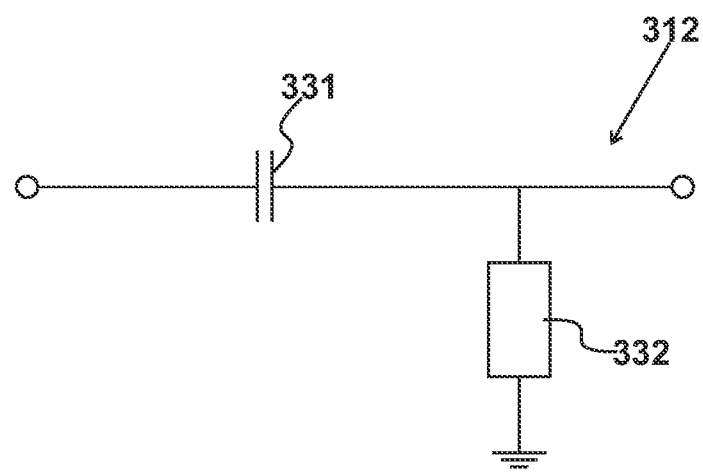

An example of an audio signal processing apparatus, included within the audio signal processing system 101, is shown in FIG. 2. An analog input signal, received on unbalanced input line 131, is supplied to a first inverter 201 which in turn provides a feedforward signal to a first gain-adjustable amplifier 202. A second gain-adjustable amplifier 203 receives a feedback signal from the output line 135. A gain controller 204 supplies a first gain-control signal to the first gain-adjustable amplifier 202. In addition, the gain controller 204 also supplies a complementary second gain-control signal to the second gain-adjustable amplifier 203. A first combiner 205 is arranged to combine a first output from the first gain-adjustable amplifier 202 with a second output from the second gain-adjustable amplifier 203.

A plurality of filter elements 211, 212 etc to 21N are configured in parallel. Each of the filter elements 211 to 21N receives an output from the first combiner 205. A second combiner 221 combines outputs from the filter elements with the original input signal, received from the output of the first inverter 201. The filter elements 211 to 21N have mutually different filtering characteristics.

The gain controller 204 supplies a complementary second gain-control signal to the second gain-adjustable amplifier that is the reciprocal of the first gain control signal supplied to the first gain control amplifier. Thus, as illustrated in FIG. 2, a gain control signal G is supplied to the first gain-adjustable amplifier 202, with a second gain control signal 1/G being supplied to the second gain-adjustable amplifier 203.

In the embodiment of FIG. 2, the output from each filter element 211 to 21N is supplied to the second combiner 221 via a respective amplifier 231, 232 to 23N.

Thus, there is a feedforward path and a feedback path. When no operation is being performed, such that G and 1/G are equal, the output sum from the first combiner 205 will be zero.

When a signal is available from the output of the first combiner 205, the filter elements 211 to 21N filter part of the available spectrum which is then submitted back to the second combiner 221 with additional gain provided by amplifiers 231 to 23N. With more gain provided by G than that provided by 1/G, the input to the first combiner 205 will be phase coherent with the signal. However, if 1/G is above one and G is below one, this input will be out of phase.

It should be appreciated that, in this embodiment, the filter is not in the main signal path and can therefore be duplicated. Many circuit types could be included in the actual filter elements 211 to 21N. A filter results in something being removed, thereby reducing the overall energy content. However, this configuration can be included within an equalizer that allows frequency components to be reduced and to be increased, with the latter possibly making the overall energy content similar to that of the original input signal. Thus, the equalizer allows volume levels to be maintained while rearranging the frequency distribution of the original signal.

In the embodiment shown in FIG. 2, a second inverter 242 provides the inverse operation of the first inverter 201. However, it can be appreciated that, when incorporated within a bigger circuit, many places may exist where an inversion of phase of this type may be performed; thereby optimizing the use of components deployed within the overall circuit. An objective of the configuration described with reference to FIG. 2 is to achieve the required results using few components while introducing minimal delay and minimal phase shift.

In an embodiment, the gain controller 204 may essentially take the form of a potentiometer which, when activated, simultaneously modifies G in one direction while modifying 1/G in the opposite direction. In more sophisticated implementations, voltage-controlled amplifiers may be deployed and changes may be performed in response to stored parameters that are recalled from memory. Alternatively, control signals of this type may be derived from a side-chain signal, as described with reference to FIG. 6.

FIG. 3

When processing analog signals, the individual filter elements may be relatively simple, consisting of little more than a resistor and a capacitor, to present a low-pass filter or a high-pass filter.

In an embodiment, the filter elements 211 to 21N are all low-pass filters with mutually different cut-off frequencies. An example 301 of a low-pass filter of this type is illustrated in FIG. 3. This consists of a series resistor 311 and parallel capacitor 312 connected to ground. As the frequency of the input signal increases, a greater proportion of the signal passes to ground via the first capacitor 312.

In an embodiment, the low-pass filters have similar circuit topologies and different cut-off frequencies are established by differing component values.

In an alternative embodiment, the filter elements 211 to 21N are all high-pass filters with mutually different cut-off frequencies. An example 321 of a high-pass filter is illustrated in FIG. 3. The filter has a series capacitor 331 and a second resistor 332 connected to ground. The second capacitor 332 will tend to block signals having a low frequency, while allowing higher frequencies to pass.

In an embodiment, the high-pass filters have similar circuit topologies and different cut-off frequencies are established by differing component values.

For the low-pass filter 301, a cut-off frequency may be identified which presents an attenuation of 3 dB (three decibels). A decade before this cut-off frequency, the filter effectively does nothing. After the cut-off frequency, attenuation occurs at 20 dB per decade, so levels of attenuation may be identified at ten times the cut-off frequency, one hundred times a cut-off frequency and so on. The filter therefore changes its characteristics at around a decade below the cut-off frequency and a decade above the cut-off frequency.

A similar cut-off frequency may be identified for the high-pass filter 321. A similar transition occurs from a plateau during which no signal passes to a plateau during which all of the signal passes.

To provide an equalizer with an improved operational characteristic, the embodiment aims to extend the transition shape over a wider frequency range. To achieve this, multiple filters are connected in parallel, as described with reference to FIG. 2, with appropriate gain values G being applied to the gain-adjustable amplifiers 202/203.

Each filter operates at a mutually different frequency point, resulting in the filtering operations being staggered. Thus, in a situation where one of the filter elements is doing nothing, the next one may be just starting to do something and then the others take over, resulting in a larger transition bandwidth. In theory, any number of filter elements may be included, until limited by the capabilities of the individual components. Thus, in a typical example, three, four, five or six filter elements may be included and a particular embodiment may include four filter elements.

As described with reference to FIG. 5, the overall response is substantially linear until a plateau is reached at very low frequencies, with a similar plateau at very high frequencies. An embodiment aims to separate these plateaus as far as possible. It has also been appreciated that phase shifts tend to cancel out.

FIG. 4

Figure 4:
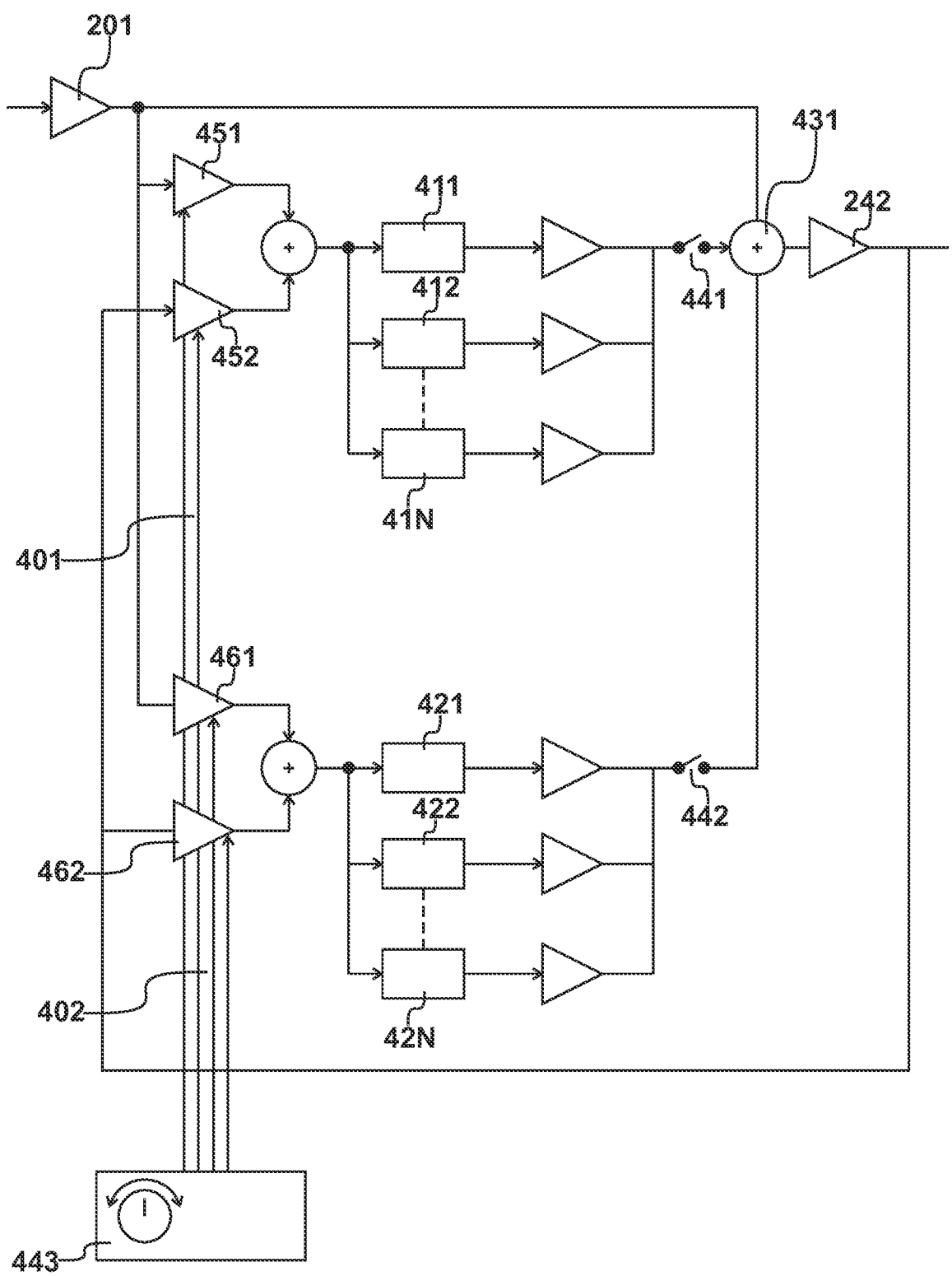
FIG. 4 shows an example of an audio signal equalizer.

An example of an audio signal equalizer is shown in FIG. 4 which may be identified as having a first audio signal processing apparatus 401 that is substantially similar to that described with reference to FIG. 2, along with a second audio signal processing apparatus 402 that is also substantially similar to the processing apparatus described reference to FIG. 2. The first audio signal processing apparatus 401 and the second audio signal processing apparatus 402 both receive a substantially similar feedforward signal from the output of the first inverter 201 and a substantially similar feedback signal from the output of the second inverter 242.

The first audio signal processing apparatus 401 includes filter elements 411, 412 to 41N. In an embodiment, filter elements 411 to 41N are all low-pass filters with mutually different cut-off frequencies and may have similar topologies as previously described. The second audio signal processing apparatus 402 is provided with filter elements 421, 422 to 42N that are all high-pass filters with mutually different cut-off frequencies and may have similar topologies.

Both outputs are supplied to an output combiner 431 via a respective first switch 441 and a respective second switch 442. Other elements in FIG. 4 are substantially similar to those described with reference to FIG. 2. Thus, the first apparatus or block 401 provides a low-pass contribution with the second apparatus or block 402 providing a high-pass contribution.

Rotation of a gain knob 443 provides higher or lower attenuation/gain, thereby representing different characteristic slopes. For this audio application, signals typically range from 20 Hz to 20 kHz and the equalizer allows a producer to rebalance the spectral density of the input signal. Thus, the first block attenuates or expands lower frequencies while the second block attenuates or expands higher frequencies. In this way, it is possible for the system to unflatten high frequencies present within a mix, for example, or, similarly, enhance contributions at the lower end of the spectrum. Thus, a first gain value may be supplied to the first amplifier 451 of the first apparatus 401, with its reciprocal being supplied to the second amplifier 452. A separately selected gain value may be supplied to the first amplifier 461 of the first apparatus 402 with, again, its reciprocal being supplied to the second amplifier 462.

FIG. 5

Figure 5:
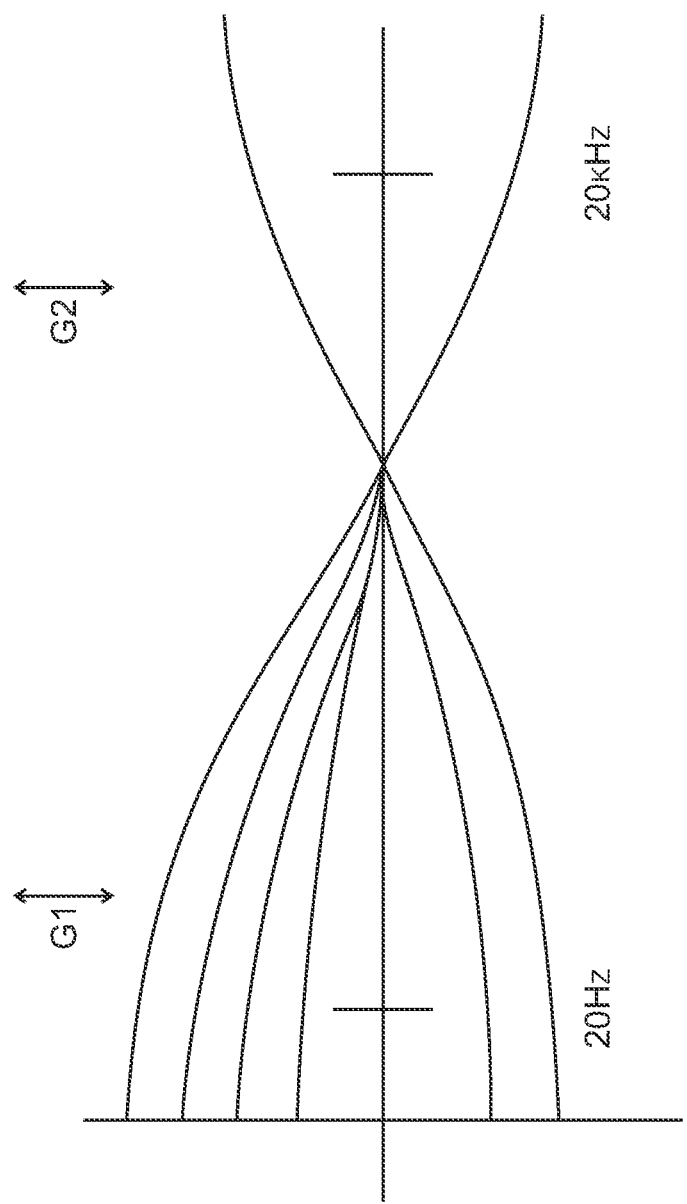
FIG. 5 shows examples of frequency responses derived from the equalizer shown in FIG. 4.

An example of a frequency response for the equalizer described with reference to FIG. 4 is shown in FIG. 5. In this example, the frequency response covers the usual audio spectrum of 20 Hz to 20 kHz. Adjustment of the first gain signal G1 changes the frequency response of the low-pass elements 411 to 41N. Similarly, adjustment of the second gain value G2 adjusts the frequency response of the high-pass elements 421 to 42N.

As shown in FIG. 5, the response is substantially linear, particularly when compared to an individual filter. As an alternative to developing sophisticated filters, the invention provides for a plurality of filter elements configured in parallel, with their filtering characteristics being mutually different and with their outputs being combined.

FIG. 6

In an embodiment, gain values are controlled by voltage-controlled amplifiers, to produce feed voltages for the values G1 and G2 from which 1/G1 and 1/G2 are derived. It is possible for this voltage to change over time in a dynamic fashion. Furthermore, this control voltage can be derived from a side-chain signal. The side-chain signal could be derived from the input signal itself or it could be derived from another reference signal. The reference signal could be derived from a specific track of recorded audio material. Thus, in an implementation, the first input 111 could receive a signal from a guitar track, the second input 112 could receive an audio signal from a kick drum track and the third input 113 could receive an input signal from a vocal track. Any of these signals could be used to derive a control signal.

Figure 6:
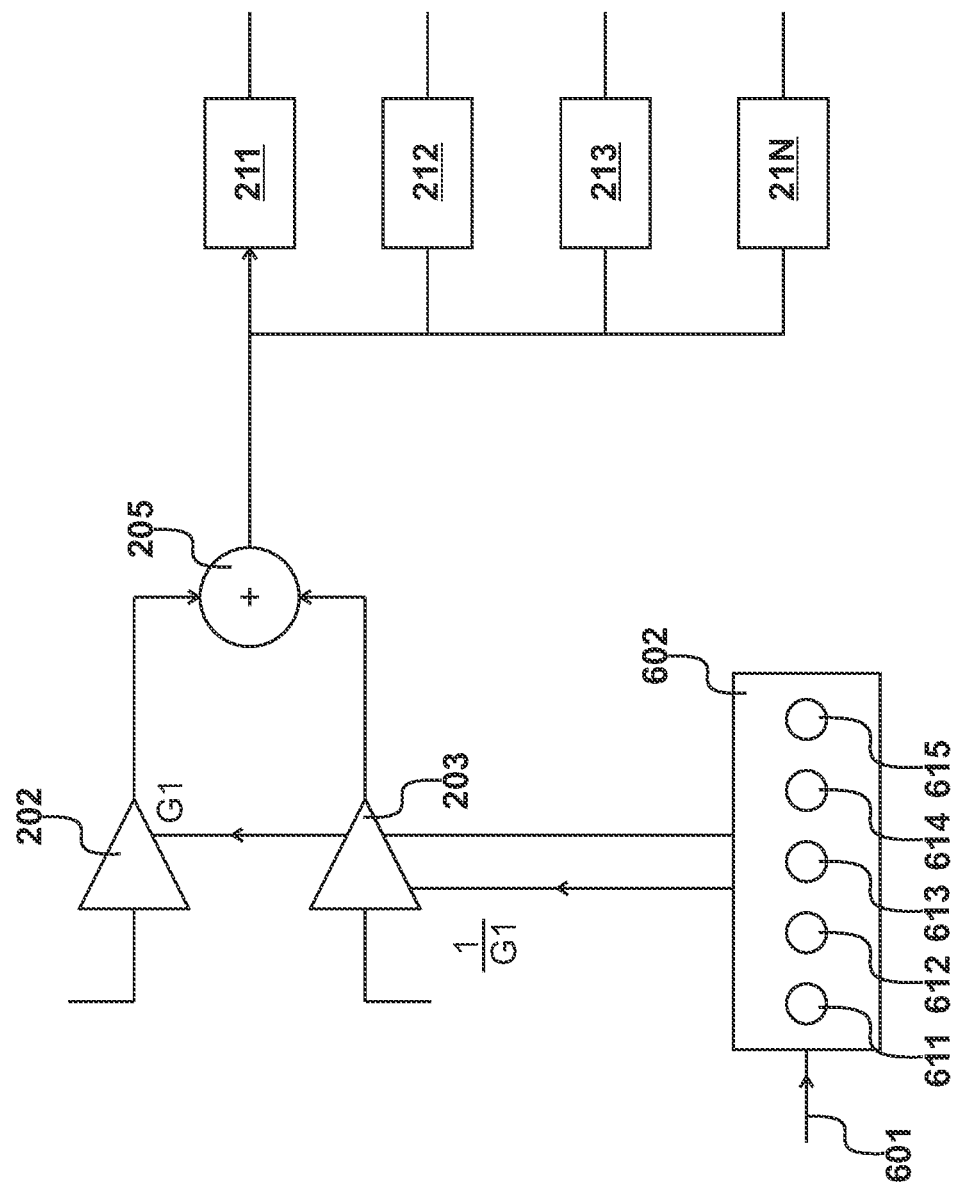
FIG. 6 shows an apparatus for deriving a control signal from a sidechain input.

In the example shown in FIG. 6, a side-chain input 601 is supplied to a side-chain gain controller 602. The gain controller 602 includes five adjustable controls, which may be implemented as soft knobs on an appropriate graphical user interface. Alternatively, in a hardware embodiment, these controls may take the form of physical knobs on a front panel.

In this embodiment, the first knob 611 controls threshold, a second knob 612 controls attack, a third knob 613 controls release, a fourth knob 614 controls a filter and a fifth knob 615 controls ratio. Threshold controls the level at which filtering takes place. Above or below this threshold, no action is taken. After crossing the threshold, action may be delayed and the extent of this delay is controlled by the attack. Thus, equalization may start immediately upon passing the threshold or the attack may be delayed.

Similarly, after deploying equalization, equalization may be released upon falling below the threshold or again the release may be delayed. This delay is controlled by the third knob 613.

The fourth knob 614 controls a filter which is typically implemented as a high-pass filter. This filters the side-chain signal before threshold detection occurs. Ratio determines the extent to which equalization is deployed in relation to the extent by which the side-chain signal departs from the defined threshold value.

FIG. 7

An embodiment of the invention also provides for a method of processing an audio signal. This may be implemented using dedicated hardware processing analog signals or processing digital signals. The processing of digital signals may also be performed by general-purpose processing devices in response to receiving appropriate instructions.

In an embodiment, at step 701 the gain of a first amplification process is controlled whereafter, at step 702, the gain of a second amplification process is controlled by a complementary extent. A feedforward signal is supplied to the first application process and a feedback signal is supplied to the second amplification process. An output from the first amplification process is combined with an output from the second amplification process at step 703.

A plurality of filtering operations are performed in parallel, identified by filter processes 704 to 707. Outputs from the filtering processes 704 to 707 are then combined at step 708.

The gain of the second amplification process is controlled at step 702 by an extent that is the reciprocal of the gain control for the first amplification process. Furthermore, each of the filtering operations 704 to 707 may also include further amplification steps for amplifying or attenuating filtered signals.

Each of the filtering operations 704 to 707 may perform a low-pass filtering operation with mutually different cut-off frequencies. Alternatively, each of the filtering operations 704 to 707 may perform a high-pass filtering operation with mutually different cut-off frequencies.

FIG. 8

Figure 7:
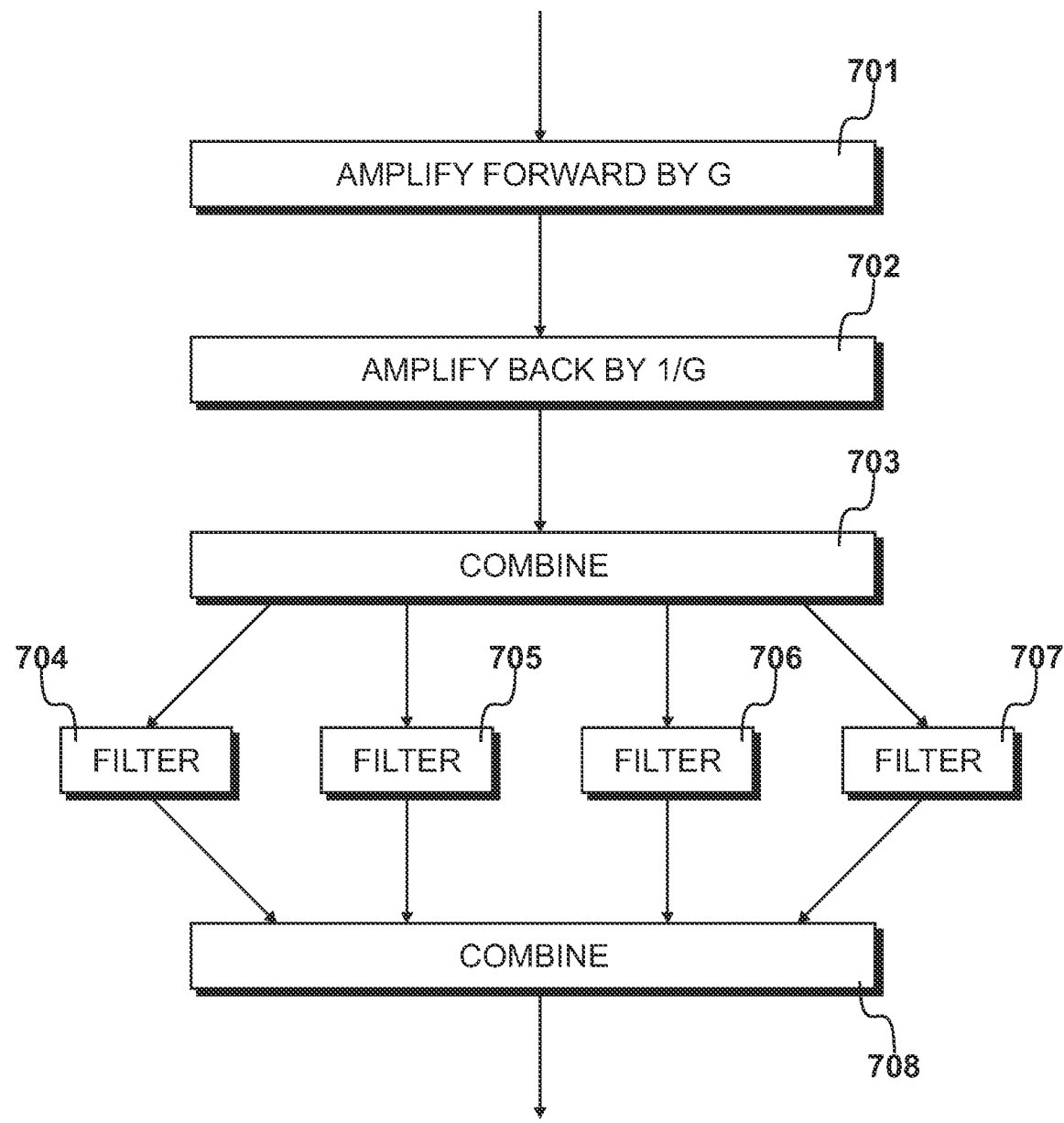
FIG. 7 illustrates procedures for processing an audio signal.
Figure 8:
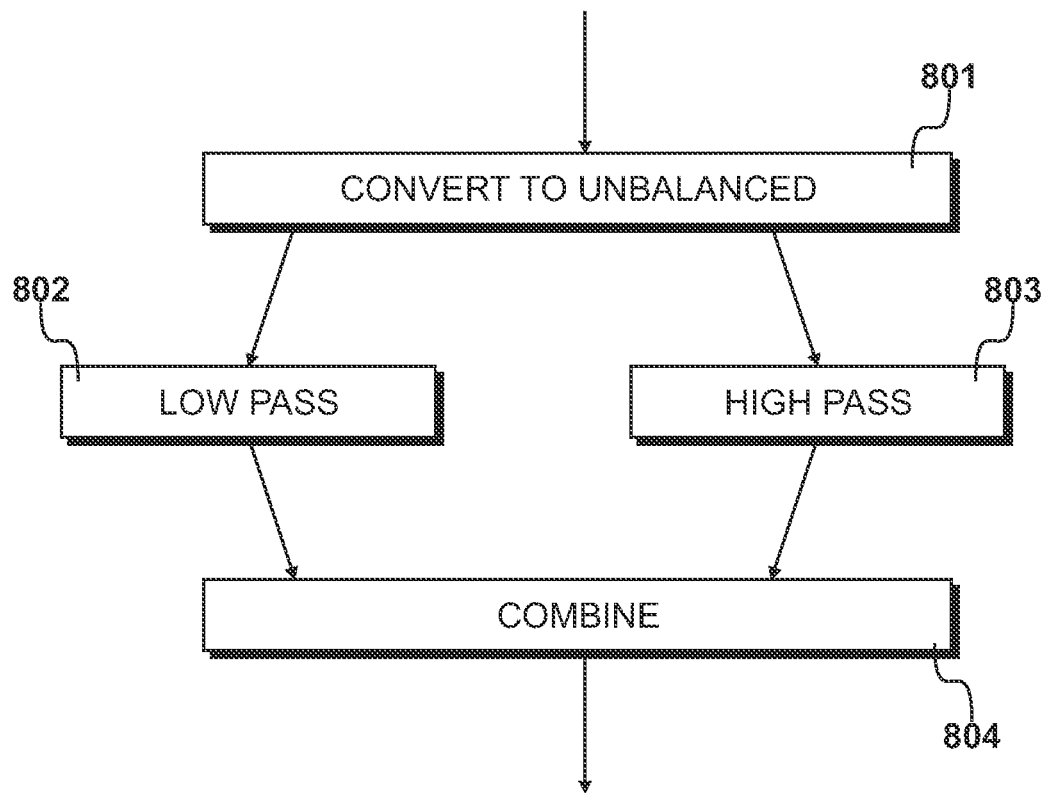
FIG. 8 shows the combining of two procedures of the type shown in FIG. 7.

Two processes of the type described with reference to FIG. 7 may be combined to present a method of equalizing an audio signal. At step 801 a balanced input, of the type described with reference to FIG. 1, is converted to an unbalanced input which is in turn supplied to a low-pass process 802 and a high-pass process 803.

In an embodiment, the low-pass process 802 and the high-pass process 803 are substantially similar to the procedures described with reference to FIG. 7 but with appropriate low-pass or high-pass filter processes 704 to 707. At step 804, all of the outputs are combined.

The invention claimed is:

1. An audio signal processing apparatus, comprising:
   a first gain-adjustable amplifier configured to receive a feed-forward signal from an input;
   a second gain-adjustable amplifier configured to receive a feed-back signal from an output;
   a gain controller configured to supply a first gain control signal to said first gain-adjustable amplifier, and to supply a complementary second gain control signal to said second gain-adjustable amplifier, wherein said complementary second gain control signal is a reciprocal of said first gain control signal;
   a first combiner arranged to combine a first output from said first gain-adjustable amplifier with a second output from said second gain-adjustable amplifier; and
   a plurality of filter elements configured in parallel, wherein:
      each filter element of said filter elements receives an output from said first combiner;
      a second combiner combines outputs from said filter elements with the feed-forward signal from the input; and
      said filter elements have mutually different filtering characteristics.

2. The audio signal processing apparatus of claim 1, wherein an output from each filter element of said filter elements is supplied to said second combiner via a respective amplifier.

3. The audio signal processing apparatus of claim 1, wherein said filter elements are all low-pass filters with mutually different cut-off frequencies.

4. The audio signal processing apparatus of claim 3, wherein:
   said low-pass filters have a similar circuit topology; and
   said mutually different cut-off frequencies are established by differing component values.

5. The audio signal processing apparatus of claim 1, wherein said filter elements are all high-pass filters with mutually different cut-off frequencies.

6. The audio signal processing apparatus of claim 5, wherein:
   said high-pass filters have a similar circuit topology; and
   said mutually different cut-off frequencies are established by differing component values.

7. An audio signal equalizer, comprising:
   a first audio signal processing apparatus according to claim 1; and
   a second audio signal processing apparatus according to claim 1, wherein:
      said first audio signal processing apparatus and said second audio signal processing apparatus both receive a substantially similar feed-forward signal and a substantially similar feed-back signal.

8. The audio signal equalizer of claim 7, further comprising a first inverter configured to invert an input signal.

9. The audio signal equalizer of claim 8, further comprising a second inverter configured to invert an output signal from said second combiner to produce a main output signal.

10. A method of processing an audio signal, comprising the steps of:
   controlling a gain of a first amplification process by a first extent and controlling a gain of a second amplification process by a second extent, wherein said second extent is a reciprocal to said first extent;
   supplying a feed-forward signal to said first amplification process and supplying a feed-back signal to said second amplification process;
   combining an output from said first amplification process with an output from said second amplification process;
   performing a plurality of filtering operations in parallel upon an output from said combining step; and
   further combining outputs from said filtering operations, wherein said filtering operations have mutually different filtering characteristics.

11. The method of claim 10, comprising further amplification steps for each respective filtering operation output.

12. The method of claim 10, wherein each filtering operation of said filtering operations performs a low-pass filtering operation, with mutually different cut-off frequencies.

13. The method of claim 10, wherein each filtering operation of said filtering operations performs a high-pass filtering operation, with mutually different cut-off frequencies.

14. A method of equalising an audio signal, comprising the steps of:
   first processing said audio signal according to claim 10; and
   second processing said audio signal according to claim 10.

15. The method of claim 14, further comprising the step of inverting an input signal.

16. The method of claim 14, further comprising the step of further inverting an output signal from said further combining step.

* * * * *